(12) United States Patent
Parekh et al.

(10) Patent No.: US 7,833,892 B2
(45) Date of Patent: Nov. 16, 2010

(54) METHOD OF FORMING A FIELD EFFECT TRANSISTOR

(75) Inventors: Kunal R. Parekh, Boise, ID (US); John K. Zahurak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 817 days.

(21) Appl. No.: 11/704,488

(22) Filed: Feb. 9, 2007

(65) Prior Publication Data

US 2007/0141821 A1    Jun. 21, 2007

Related U.S. Application Data

(62) Division of application No. 11/003,275, filed on Dec. 3, 2004, now Pat. No. 7,276,433.

(51) Int. Cl.
| H01L 21/3205 | (2006.01) |
| H01L 21/4763 | (2006.01) |
| H01L 21/44 | (2006.01) |
| H01L 21/336 | (2006.01) |

(52) U.S. Cl. .................. 438/595; 438/592; 438/655; 438/303

(58) Field of Classification Search ............ 438/595, 438/596, 682, 581, 592, 655, 583, 585, 184, 438/303, 308, 630, 649, 651
See application file for complete search history.

(56) References Cited

U.S. PATENT DOCUMENTS

| 5,247,197 | A |  | 9/1993 | Ema |
| 5,405,798 | A |  | 4/1995 | Ema |
| 5,472,887 | A |  | 12/1995 | Hutter et al. |
| 5,495,439 | A |  | 2/1996 | Morihara |
| 5,527,722 | A |  | 6/1996 | Hutter et al. |
| 5,581,114 | A |  | 12/1996 | Bashir et al. |
| 5,777,920 | A |  | 7/1998 | Ishigaki et al. |
| 5,844,276 | A |  | 12/1998 | Fulford et al. |
| 5,866,934 | A |  | 2/1999 | Kadosh et al. |
| 5,888,854 | A |  | 3/1999 | Morihara |
| 5,939,760 | A |  | 8/1999 | Batra et al. |
| 6,063,681 | A | * | 5/2000 | Son ........................ 438/303 |
| 6,180,472 | B1 |  | 1/2001 | Akamatsu et al. |
| 6,180,477 | B1 | * | 1/2001 | Liao ........................ 438/305 |
| 6,258,671 | B1 |  | 7/2001 | Manning |
| 6,306,701 | B1 | * | 10/2001 | Yeh ........................ 438/231 |
| 6,312,982 | B1 |  | 11/2001 | Takato et al. |
| 6,329,251 | B1 |  | 12/2001 | Wu |
| 6,383,872 | B1 |  | 5/2002 | Kadosh et al. |

(Continued)

OTHER PUBLICATIONS

Cataldo, 'Embedded DRAM gets pure-logic performance', [online]. Sep. 11, 2000, EETimes, pp. 1-3, [retrieved on Sep. 9, 2004]. Retrieved from the Internet: <URL:http://www.eetimes.com/article/printableArticle.jhtml;jsessionid=IX1AOLUTNJ4PKOSN...>.

*Primary Examiner*—Chuong A. Luu
(74) *Attorney, Agent, or Firm*—Wells St. John P.S.

(57) ABSTRACT

The invention includes methods of forming integrated circuitry, methods of forming memory circuitry, and methods of forming field effect transistors. In one implementation, conductive metal silicide is formed on some areas of a substrate and not on others. In one implementation, conductive metal silicide is formed on a transistor source/drain region and which is spaced from an anisotropically etched sidewall spacer proximate a gate of the transistor.

13 Claims, 8 Drawing Sheets

U.S. PATENT DOCUMENTS

| | | |
|---|---|---|
| 6,383,877 B1 | 5/2002 | Ahn et al. |
| 6,420,250 B1 | 7/2002 | Cho et al. |
| 6,492,665 B1 | 12/2002 | Akamatsu et al. |
| 6,501,114 B2 | 12/2002 | Cho et al. |
| 6,548,339 B2 | 4/2003 | Manning |
| 6,642,134 B2 | 11/2003 | Ishida et al. |
| 6,707,154 B2 | 3/2004 | Terauchi et al. |
| 6,806,190 B2 * | 10/2004 | Lin .......................... 438/682 |
| 6,995,437 B1 | 2/2006 | Kinoshita et al. |
| 7,211,515 B2 * | 5/2007 | Lee et al. .................. 438/682 |
| 7,276,433 B2 | 10/2007 | Parekh et al. |
| 7,439,138 B2 | 10/2008 | Parekh et al. |
| 2001/0005630 A1 | 6/2001 | Kim et al. |
| 2002/0025644 A1 | 2/2002 | Cho et al. |
| 2002/0068395 A1 | 6/2002 | Tran et al. |
| 2003/0025163 A1 | 2/2003 | Kwon |
| 2003/0073277 A1 | 4/2003 | Cho et al. |
| 2005/0026380 A1 * | 2/2005 | Kammler et al. ............ 438/305 |
| 2005/0176202 A1 | 8/2005 | Hisamoto et al. |
| 2006/0121677 A1 | 6/2006 | Parekh et al. |
| 2006/0264019 A1 | 11/2006 | Parekh et al. |
| 2007/0032011 A1 | 2/2007 | Parekh et al. |
| 2007/0141821 A1 | 6/2007 | Parekh et al. |
| 2007/0298570 A1 | 12/2007 | Parekh et al. |

* cited by examiner

METHOD OF FORMING A FIELD EFFECT TRANSISTOR

RELATED PATENT DATA

This patent resulted from a divisional application of U.S. patent application Ser. No. 11/003,275, filed Dec. 3, 2004 now U.S. Pat. No. 7,276,433, entitled "Methods of Forming Integrated Circuitry, Methods of Forming Memory Circuitry, and Methods of Forming Field Effect Transistors", naming Kunal R. Parekh and John K. Zahurak as inventors, the disclosure of which is incorporated by reference.

TECHNICAL FIELD

This invention relates to methods of forming integrated circuitry, to methods of forming memory circuitry, and to methods of forming field effect transistors.

BACKGROUND OF THE INVENTION

Conductive metal suicides are commonly used in integrated circuitry fabrication due to their high electrical conductivities. For example, such materials are used as conductive strapping layers over conductively doped polysilicon gate lines. Such materials are also used as contact interfaces for conductive contacts. For instance in many integrated circuits, electrically conductive plugs (for example elemental metals, alloys, metal compounds, or conductively doped semiconductive material) are electrically connected with underlying conductively doped silicon. Conductive metal suicides make excellent conductive interfaces between underlying conductively doped semiconductive material and the same or other conductive material received thereover. However, there are instances where it is desired that conductive metal suicides not be utilized in such contacts, for example where excessive leakage current to underlying substrate material is problematic. Accordingly, in fabricating contacts at a given elevation within a substrate, it is sometimes desirable that suicides be formed in some regions and not in others.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

This invention includes methods of forming integrated circuitry, including methods of forming memory circuitry, and includes methods of forming field effect transistors. In one implementation, a method of forming memory circuitry includes providing a silicon-comprising substrate comprising a memory array area and a peripheral circuitry area. The memory array area comprises a first pair of spaced adjacent conductive structures received over the silicon-comprising substrate in at least a first cross-section of the substrate. The peripheral circuitry area comprises a second pair of spaced adjacent conductive structures received over the silicon-comprising substrate at least in a second cross-section of the substrate. The conductive structures of the second pair are spaced further from one another in the second cross-section than are those of the first pair in the first cross-section. A masking material is deposited between the conductive structures of each of the first and second pairs. The masking material is removed effective to expose silicon between the conductive structures of the second pair in the second cross-section but not between the conductive structures of the first pair in the first cross-section. After the removing effective to expose silicon, metal is deposited over the substrate and the substrate is annealed effective to react the metal with silicon of the substrate to form a conductive metal silicide between the conductive structures of the second pair in the second cross-section but not between the conductive structures of the first pair in the first cross-section. After the annealing, at least some of the masking material is removed from between the conductive structures of the first pair in the first cross-section.

In one implementation, conductive material is deposited between the conductive structures of each of the first and second pairs independent of whether at least some of the masking material is removed from between the conductive structures of the first pair in the first cross-section after the annealing.

In one implementation, a method of forming integrated circuitry includes providing a silicon-comprising substrate comprising a first circuitry area and a second circuitry area. The first circuitry area comprises a first pair of spaced adjacent gate electrodes received over the silicon-comprising substrate in at least a first cross-section of the substrate. Spaced and facing anisotropically etched electrically insulative sidewall spacers are provided in the first cross-section between the gate electrodes of the first pair. The second circuitry area comprises a second pair of spaced adjacent gate electrodes received over the silicon-comprising substrate in at least a second cross-section of the substrate. Spaced and facing anisotropically etched electrically insulative sidewall spacers are provided in the second cross-section between the gate electrodes of the second pair. The facing anisotropically etched sidewall spacers between the second pair are spaced further from one another in the second cross-section than are those received between the first pair in the first cross-section. A masking material is deposited between the facing anisotropically etched sidewall spacers received between each of the first and second pairs of gate electrodes. The masking material is removed effective to expose silicon between the facing anisotropically etched sidewall spacers received between the second pair in the second cross-section but not between the facing anisotropically etched sidewall spacers received between the first pair in the first cross-section. After the removing, metal is deposited over the substrate and the substrate is annealed effective to react the metal with silicon of the substrate to form a conductive metal silicide between the facing anisotropically etched sidewall spacers received between the second pair in the second cross-section but not between the facing anisotropically etched sidewall spacers received between the first pair in the first cross-section.

In one implementation, a method of forming a field effect transistor includes forming a gate electrode of a field effect transistor over a silicon-comprising substrate. The gate electrode comprises a sidewall. A first electrically insulative anisotropically etched sidewall spacer is formed over the sidewall of the gate electrode. A second anisotropically etched sidewall spacer if formed over and distinct from the first sidewall spacer. A metal is deposited over the first and second sidewall spacers and over silicon of a source/drain region of the transistor proximate the second sidewall spacer.

The substrate is annealed effective to react the metal with silicon of the substrate to form an electrically conductive metal silicide on the source/drain region which is spaced from the first sidewall spacer.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
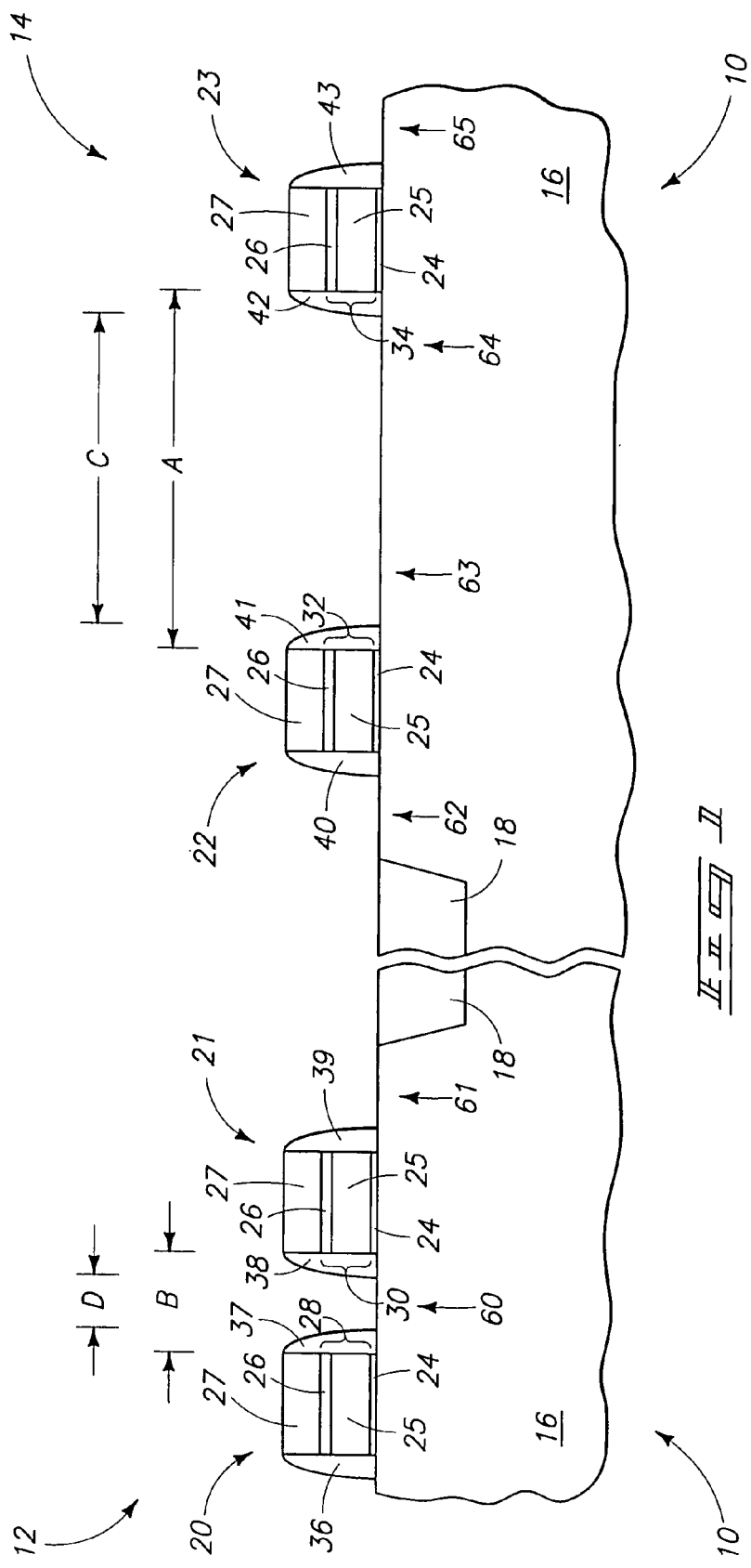
FIG. 1 is a fragmentary diagrammatic sectional view taken through a semiconductor substrate in process in accordance with an aspect of the invention.

Preferred aspects of the invention are initially described with reference to FIGS. 1-7. In certain implementations, the invention contemplates methods of forming integrated circuitry, for example in certain implementations, memory circuitry. Referring initially to FIG. 1, such depicts a silicon-comprising substrate 10 comprising a first circuitry area 12 and a second circuitry area 14. In but one exemplary preferred implementation, circuitry area 12 comprises a memory array area, and circuitry area 14 comprises a peripheral circuitry area. For example, and by way of example only, peripheral circuitry area 14 might ultimately be fabricated to include control, programming and/or logic circuitry associated with the operation of memory circuitry within memory array area 12. Memory array area 12, by way of example only, might comprise one or a combination of DRAM, SRAM and/or other memory circuitry, whether existing or yet-to-be developed. Alternately and by way of example only, first and second circuitry areas 12 and 14 might otherwise be characterized, and include the same or other existing or yet-to-be developed circuitry, as will be apparent from the continuing discussion. Further, each of the first and second circuitry areas might not include any memory array circuitry.

FIG. 1 depicts an exemplary silicon-comprising substrate in the form of bulk monocrystalline silicon material 16 having respective trench isolation regions 18 formed therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Of course, semiconductor-on-insulator and other substrates are contemplated, and whether existing or yet-to-be developed.

FIG. 1 depicts a pair of device constructions 20, 21 within first circuitry area 12, and a pair of device constructions 22, 23 within second circuitry area 14. In the exemplary depicted embodiment, such comprise gate constructions. By way of example only, such are depicted as comprising gate dielectric layers 24, conductively doped polysilicon regions 25, overlying conductive metal silicide regions 26 and electrically insulative caps 27. Accordingly in one exemplary implementation, conductive regions 25 and 26 can be considered as comprising a first pair of spaced adjacent conductive structures 28 and 30 (in this particular example conductive gate electrodes) received over silicon-comprising substrate 16 in at least a first cross-section of the substrate. For example, such first cross-section is depicted as being upon the plane of the page which such are received within first circuitry/memory array area 12. Towards the right of FIG. 1, conductive regions 25 and 26 can be considered as comprising a second pair of spaced adjacent conductive structures 32, 34 received over silicon-comprising substrate 16 within second circuitry area 14 at least in a second cross-section of the substrate, for example as depicted by the plane of the page upon which such devices are received within second circuitry area 14. In the context of this document, a "cross-section" defines a plane within which lies a shortest straight line that can be drawn between two spaced adjacent conductive structures at issue, for example conductive structures 28 and 30 within first circuitry area 12 in one instance and conductive structures 32 and 34 within second circuitry area 14 in another instance.

As shown, conductive structures 32 and 34 of the second pair are spaced further from one another in the depicted second cross-section (shown by a distance A) than are those spaced adjacent conductive structures 28 and 30 of the first pair in the first cross-section (shown by a distance B). By way of example only, the spacing dimension A typically is at least 1300 Angstroms, and the spacing dimension B typically ranges between 600 Angstroms and 1000 Angstroms in existing minimum feature technology. Further by way of example only, a typical collective thickness for materials 24, 25, 26 and 27 is on the order of 2,000 Angstroms.

In one preferred implementation, an anisotropically etched electrically insulative sidewall spacer is formed over a sidewall of at least one of the conductive structures in at least one of the first and second cross-sections. For example as shown, FIG. 1 depicts anisotropically etched insulative sidewall spacers 36, 37 and 38, 39 associated with conductive structures 28 and 30, respectively, within first circuitry area 12 in the depicted first cross-section. Further, FIG. 1 also depicts anisotropically etched electrically insulative sidewall spacers 40, 41 and 42, 43 associated with conductive structures 32 and 34, respectively, within second circuitry area 14 in the depicted second cross-section. For purposes of the continuing discussion and in but one exemplary preferred embodiment, spacers 37 and 38 can be considered as spaced and facing anisotropically etched insulative sidewall spacers provided in the depicted first cross-section in first circuitry area 12 between gate electrodes 28 and 30 of such first pair. Further, spacers 41 and 42 can be considered as spaced and facing anisotropically etched insulative sidewall spacers provided in the second cross-section in second circuitry area 14 between gate electrodes 32 and 34 of such second pair. Facing anisotropically etched sidewall spacers 41 and 42 between the second pair of gate electrodes are spaced further from one another by a distance C in the depicted second cross-section than are those spacers 37 and 38 by a distance D received between first pair of gate electrodes 28 and 30 in the depicted first cross-section in first circuitry area 12. By way of example only, and in present generation minimum photolithographic feature processing, an exemplary dimension C is at least 1000 Angstroms, with that for dimension D being from 320 Angstroms to 600 Angstroms. Exemplary preferred materials for the depicted spacers 36-43 and for insulative caps 27 include silicon nitride and undoped silicon dioxide. Such spacers and caps might be of the same material or different materials.

By way of example only, numerals 60, 61, 62, 63, 64 and 65 depict exemplary source/drain regions of the exemplary field effect transistors being fabricated. Such regions might be fully doped, partially doped, or substantially void of conductivity enhancing doping at this point in the process. Further and regardless, such regions might comprise elevated source/drain regions.

Figure 2:
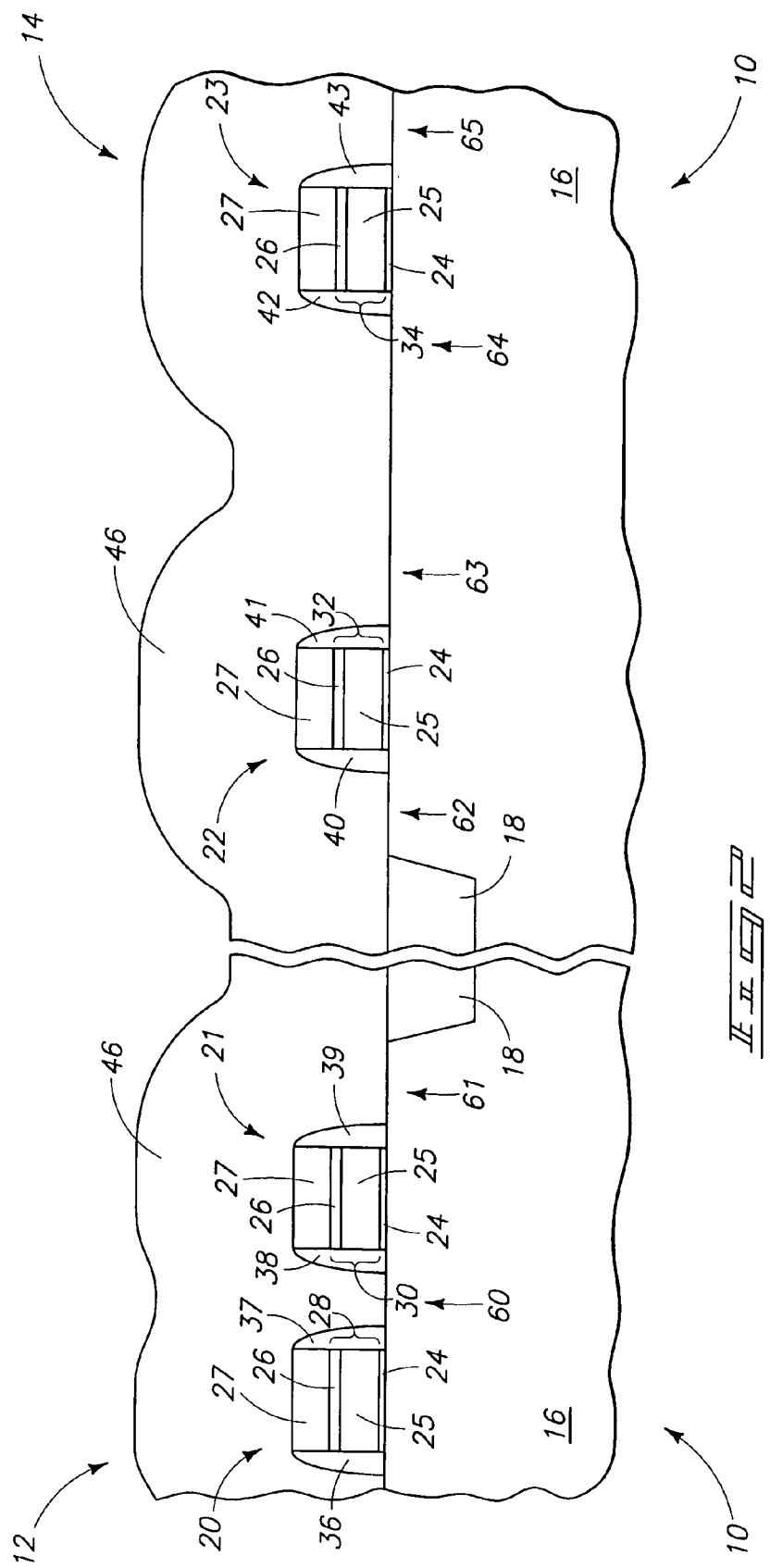
FIG. 2 is a view of the FIG. 1 substrate at a processing step subsequent to that shown by FIG. 1.

Referring to FIG. 2, a masking material 46 has been deposited between the conductive structures 28, 30 and 32, 34 of each of the first and second pairs of such depicted structures, respectively. Further and accordingly in the depicted preferred embodiment, such masking material 46 is also deposited between facing anisotropically etched sidewall spacers 37, 38 and 41, 42 received between each of the first and second pairs of gate electrodes 28, 30 and 32, 34, respectively. An exemplary deposition thickness range for masking material 46 is from 200 Angstroms to 700 Angstroms.

In one preferred implementation, masking material 46 comprises a material that can be selectively etched relative to spacers 36-43, and also preferably relative to insulative caps 27, and also preferably relative to substrate material 16. In the context of this document, a selective etch is where removal of one material relative to another occurs at a removal ratio of at least 2:1. Masking material 46 might be electrically conductive, electrically insulative or semiconductive. By way of example only, exemplary electrically insulative materials include silicon nitride and silicon dioxide. Exemplary semiconductive materials include doped semiconductive materials, for example silicon and gallium arsenide. Exemplary preferred electrically conductive materials are conductive metal nitrides, for example tungsten nitride and titanium nitride. Additional exemplary masking materials include amorphous carbon and transparent carbon.

Any such materials can be deposited by any existing or yet-to-be developed methods, for example preferably by CVD. For example, silicon dioxide can be deposited by bubbling an inert gas through tetraethylorthosilicate. Silicon nitride can be chemical vapor deposited using silane and ammonia. Tungsten nitride can be chemical vapor deposited from $WF_6$ and $NH_3$. Titanium nitride can be chemical vapor deposited from $TiCl_4$ and $NH_3$. Amorphous and transparent carbons can be chemical vapor deposited from $C_3H_6$ and otherwise as disclosed in our U.S. patent application Ser. No. 10/817,029, filed on Apr. 1, 2004, naming Garo J. Derderian and H. Montgomery Manning as inventors, and entitled "Method Of Forming Trench Isolation Regions", and which is now U.S. Pat. No. 7,015,113, the disclosure of which is hereby fully incorporated by reference as if separately presented in its entirety herein. Such are preferably boron doped at least to facilitate step coverage in the deposition.

Figure 3:
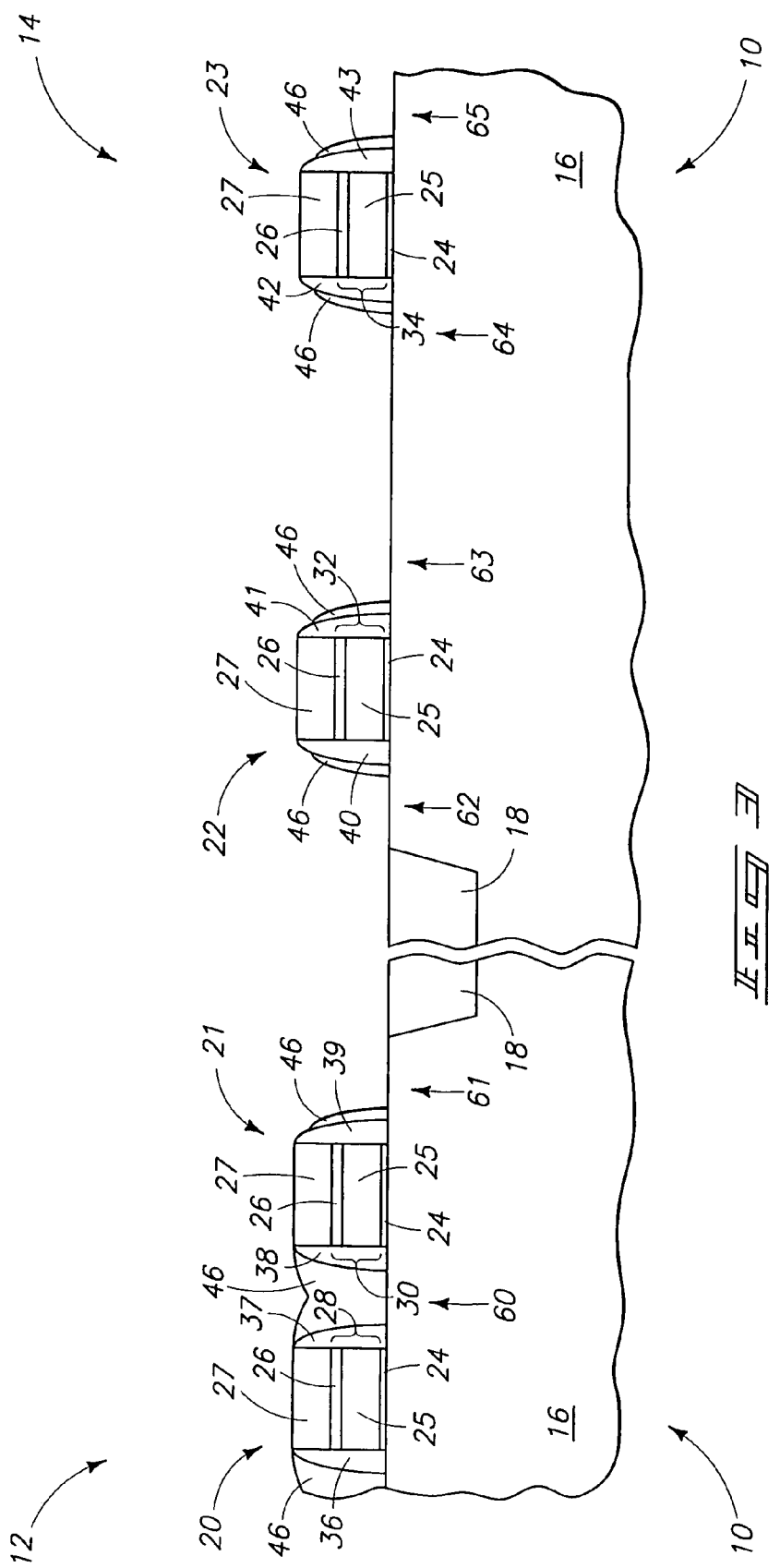
FIG. 3 is a view of the FIG. 2 substrate at a processing step subsequent to that shown by FIG. 2.

Referring to FIG. 3, masking material 46 has been removed effective to expose silicon between conductive structures 32 and 34 of such second pair in the depicted second cross-section, but not between conductive structures 28 and 30 of such first pair in the depicted first cross-section. Further and accordingly in the depicted preferred FIG. 3 embodiment, such removing has been effective to expose silicon between facing anisotropically etched sidewall spacers 41 and 42 received between the second pair of conductive gate electrodes in the depicted second cross-section, but not between facing anisotropically etched sidewall spacers 37 and 38 received between the first pair of conductive gate electrodes in the depicted first cross-section. Further, in one preferred technique and as depicted, the removing of the masking material is ineffective to expose any of conductive material 25, 26 of gate electrodes 28, 30 and 32, 34 in the depicted first and second cross-sections, respectively.

The preferred technique for removing masking material 46 comprises chemical etching, and which is substantially selective relative to the material of spacers 36-43. For example, and by way of example only, where the depicted insulative spacers and caps comprise silicon nitride, an exemplary etching chemistry for etching amorphous or transparent carbon in an anisotropic manner as depicted includes any suitable fluorine-containing plasma etch, and for an isotropic etch an example would be sulfuric acid and hydrogen peroxide. For silicon dioxide, exemplary isotropic etch chemistries would include a dilute hydrofluoric acid etch, and a buffered oxide etch using $NH_4F$ and HF; and for an anisotropic etch would include any suitable fluorine containing plasma etch. For tungsten nitride, an exemplary isotropic etch chemistry would include fluorine, $NF_3$, and Ar, and for an anisotropic etch would include either plasma $NF_3$ and chlorine or plasma HBr and flourine. For titanium nitride, an exemplary isotropic etch chemistry would include dilute hydrofluoric acid, and for an anisotropic etch would include chlorine.

Preferably, the depositing of masking material 46 through the removing of the masking material 46 of FIG. 3 occurs without any photolithographic patterning at least within the depicted first and second cross-sections, and even more preferably without any photolithographic patterning anywhere on the substrate from the depositing of the masking material through the removing thereof as depicted in FIG. 3. FIG. 3 depicts such removing as leaving secondary sidewall spacers of material 46 over insulative sidewall spacers 39, 40, 41, 42 and 43.

Figure 4:
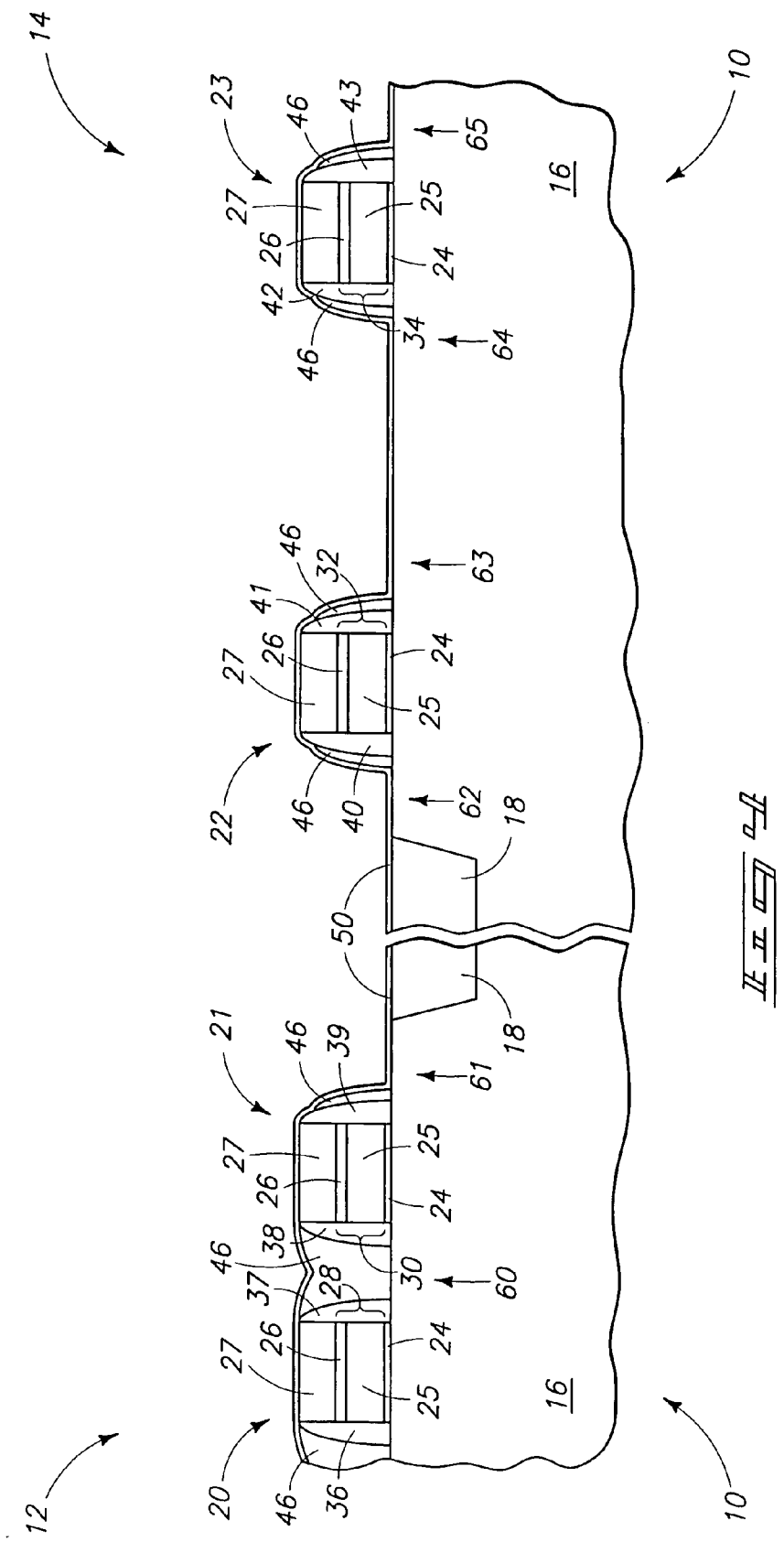
FIG. 4 is a view of the FIG. 3 substrate at a processing step subsequent to that shown by FIG. 3.

Referring to FIG. 4, a metal 50 has been deposited over the substrate. Exemplary preferred metals include cobalt, tungsten, titanium, and nickel. By way of example only, a preferred deposition thickness for metal 50 is from 100 Angstroms to 500 Angstroms.

Figure 5:
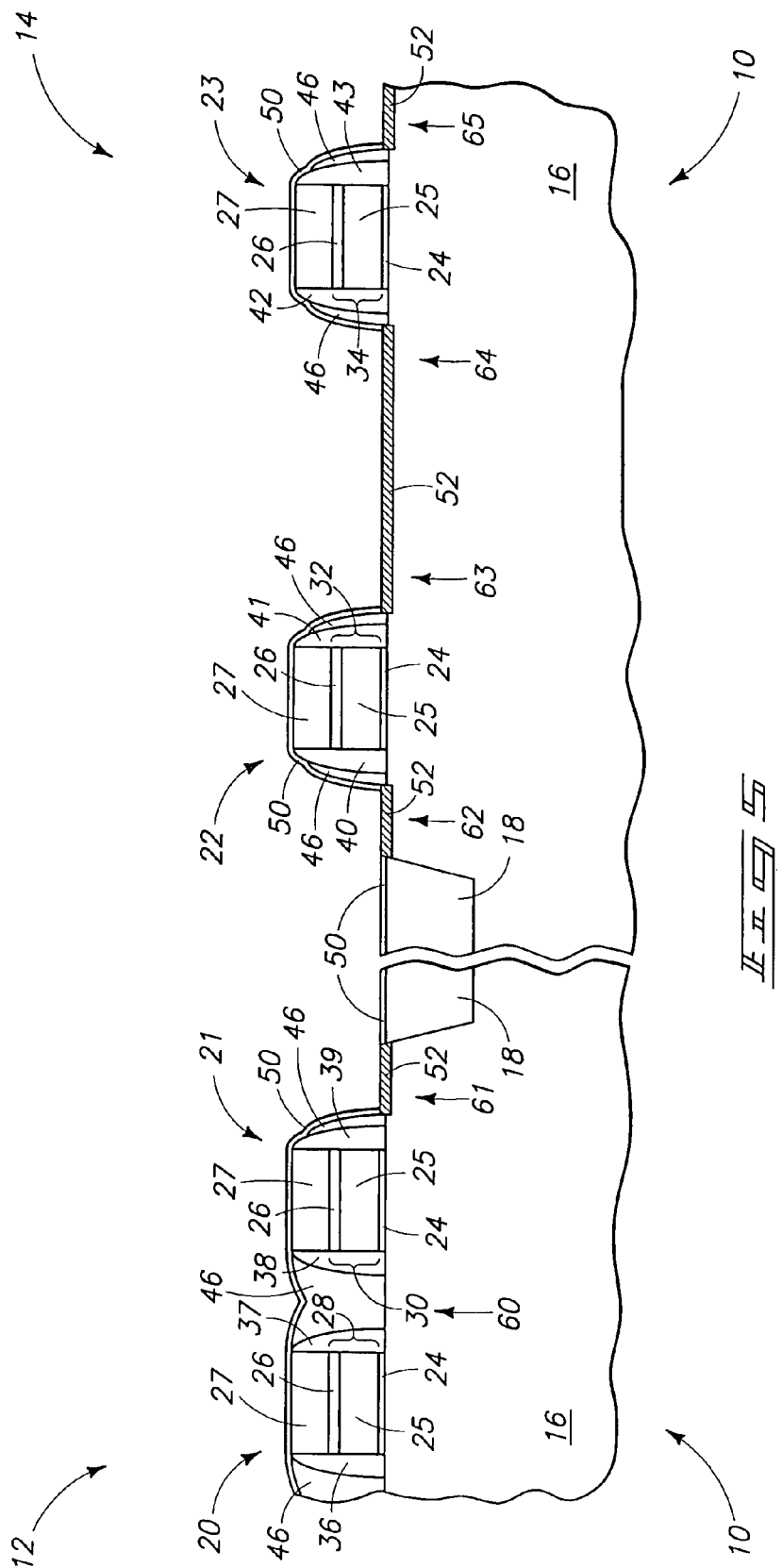
FIG. 5 is a view of the FIG. 4 substrate at a processing step subsequent to that shown by FIG. 4.

Referring to FIG. 5, substrate 10 with deposited metal 50 has been annealed effective to react such metal with silicon of the substrate (i.e., silicon from material 16) to form conductive metal silicide 52, with at least some of such being received between conductive structures 32 and 34 of such second pair of such structures in the depicted second cross-section of second circuitry area 14, but not between conductive structures 28 and 30 of such first pair of such structures in the depicted first cross-section in first circuitry area 12. Such depositing of metal 50 and the annealing of the substrate might occur simultaneously over at least some period of time during the deposition of metal 50. Additionally or alternately, such depositing of metal and annealing of the substrate might occur over at least some non-simultaneous periods of time, for example as is essentially depicted by the combination of FIGS. 4 and 5. Exemplary preferred annealing conditions for producing the depicted metal silicide regions 52 are in an inert atmosphere from 400° C. to 1020° C. for from 1 second to 5 hours. Such processing of metal depositing and substrate annealing is in the depicted preferred embodiment effective to react the metal with silicon of the substrate to form conductive metal silicide 52 at least between facing anisotropically etched sidewall spacers 41 and 42, but not between facing anisotropically etched sidewall spacers 37 and 38. Further in the illustrated and preferred embodiment, the metal depositing and substrate annealing are ineffective to form suicide on the conductive material 25, 26 of the gate electrodes in the first and second cross-sections, for example at least due to spacing of metal 50 therefrom by material of the spacers and the caps 27.

Figure 6:
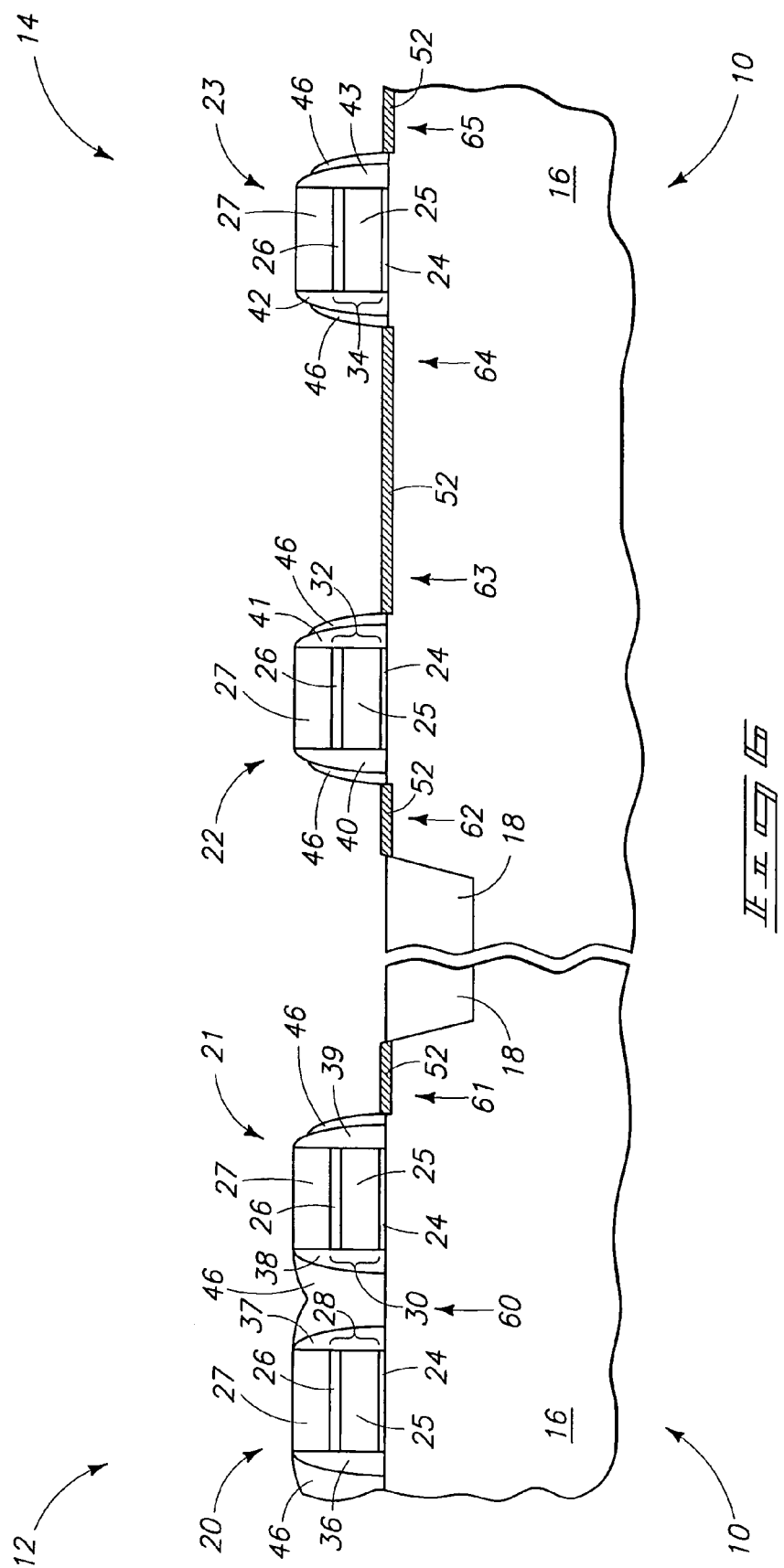
FIG. 6 is a view of the FIG. 5 substrate at a processing step subsequent to that shown by FIG. 5.

Referring to FIG. 6, unreacted metal material 50 has been removed from the substrate, for example by selective chemical etching.

Figure 7:
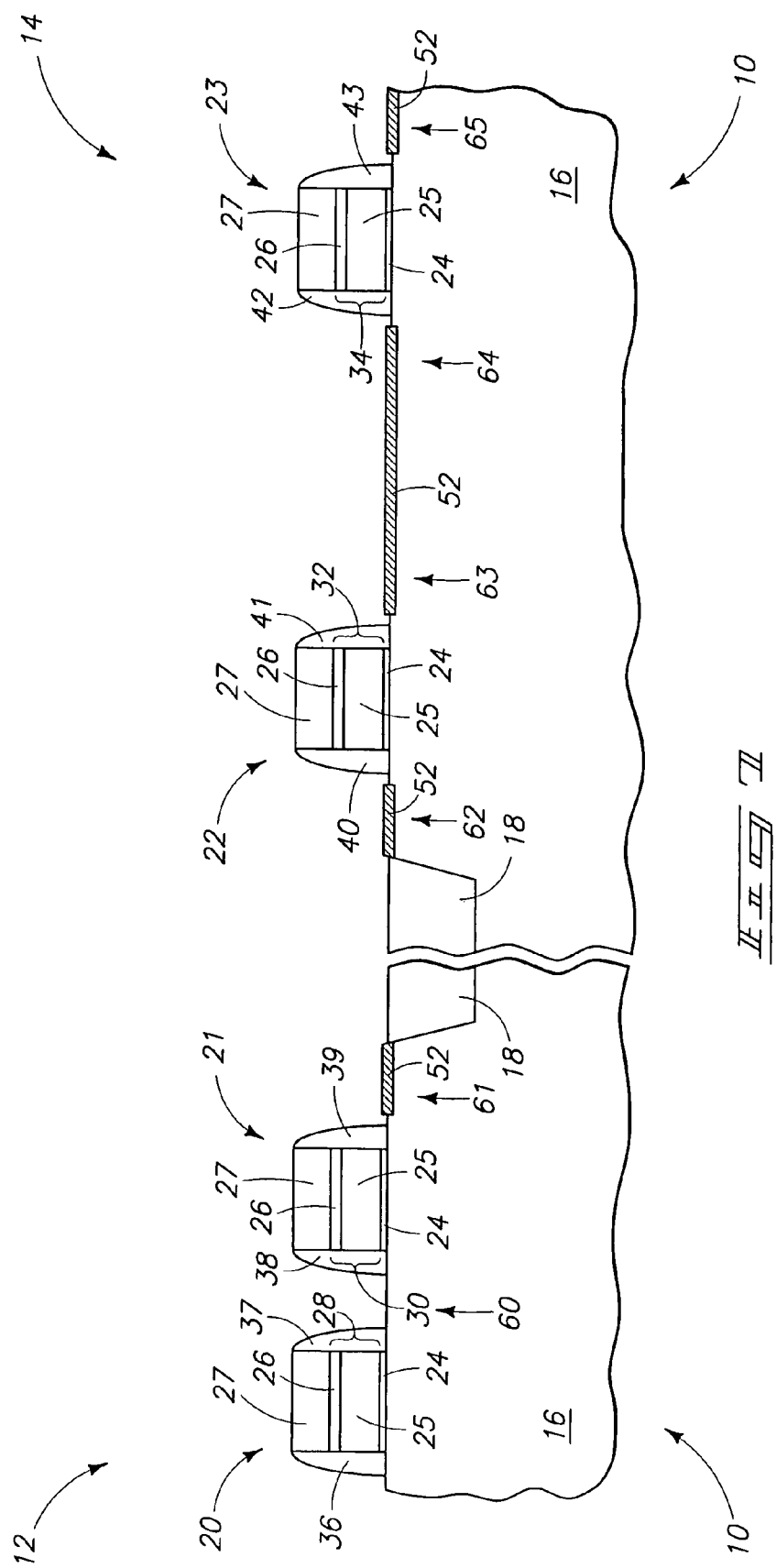
FIG. 7 is a view of the FIG. 6 substrate at a processing step subsequent to that shown by FIG. 6.

Referring to FIG. 7, at least some of masking material 46 has subsequently been removed from between conductive structures 28 and 30 of such first pair of structures in the depicted first cross-section in first circuitry area 12. Preferably and as shown, such removing after the annealing is of all of masking material 46 in the depicted first cross-section, and even more preferably as shown such removing is of all such masking from the substrate. By way of example only, continued etching utilizing any of the above exemplary chemistries are exemplary removing techniques. In the depicted exemplary embodiment, such leaves silicide regions 52 spaced from the respective depicted anisotropically etched and electrically insulative sidewall spacers 39, 40, 41, 42 and 43. Alternately, by way of example only, some or all of the FIG. 6 depicted masking material 46 might remain over the substrate. Regardless, subsequent processing can, of course, occur in the fabrication of integrated circuitry over and/or as part of the substrate. Of course, any of exposed spacers 39, 40, 41, 42 and 43 could be removed as well, although such is not preferred.

The invention also contemplates a method of forming a field effect transistor. Such a method includes forming a gate electrode of a field effect transistor over a silicon-comprising substrate. For example, and by way of example only, any of gate electrodes 30, 32 or 34 constitute exemplary such gate electrodes formed over an exemplary silicon-comprising substrate 16. Any of such gate electrodes comprise some sidewall, for example and by way of example only, the depicted sidewalls which happen to be vertically oriented with respect to gate electrodes 30, 32 or 34. Other than straight-line and/or vertically oriented sidewalls are also of course contemplated.

A first electrically insulative anisotropically etched sidewall spacer is formed over the particular sidewall of the particular gate electrode. For example, and by way of example only, any one of spacers 39, 40, 41, 42 or 43 constitute an exemplary such spacer.

A second anisotropically etched sidewall spacer is formed over and distinct from the first sidewall spacer. For example, and by way of example only, any of the depicted five remaining spacers 46 (remnant from removing masking material 46) in FIG. 3 received laterally over first sidewall spacers 39, 40, 41, 42 and 43 are, individually, examples of such a second anisotropically etched spacer which is in some way distinct (meaning discernible is some way from) first spacers 39, 40, 41, 42 or 43. In the depicted preferred embodiments of FIG. 3, such second sidewall spacers are formed "on" (meaning everywhere in this document as being in at least some direct physical contact therewith) the depicted spacers 39, 40, 41, 42 or 43. Most preferably, the second sidewall spacer is comprised of a material which is different from that of the first sidewall spacer. Further and regardless, the second sidewall spacer might comprise an electrically conductive material, an electrically insulative material, a semiconductive material, or some combination thereof. Exemplary preferred materials for the first and second spacers, and by way of example only, include any of those described above for spacers 36-43 and material 46.

A metal is deposited over the first and second sidewall spacers and over silicon of a source/drain region of the transistor proximate the second sidewall spacer. By way of example only, FIG. 4 depicts such an embodiment with respect to metal layer 50. Such embodiment also depicts one preferred implementation where the metal is deposited on the first sidewall spacer, on the second sidewall spacer, and on silicon of the source/drain region.

The substrate is annealed effective to react the metal with silicon of the substrate to form an electrically conductive metal silicide on the source/drain region which is spaced from the first sidewall spacer. For example, and by way of example only, any one of regions 52 in FIG. 5 depicts such an exemplary electrically conductive metal silicide region. Attributes with respect to such depositing of metal and the annealing thereof, as well as any other attribute(s) with respect to preferred embodiments of forming a field effect transistor, are the same as those described above in connection with the embodiments of methods of forming integrated circuitry, including methods of forming memory circuitry.

In one further preferred implementation of a method of forming a field effect transistor as-described, the second sidewall spacer is removed from the substrate after the annealing. For example, and by way of example only, such is depicted in the exemplary embodiment of FIG. 7.

Regardless of removal of second sidewall spacer material, in some instances by way of example only it might be desirable to space the metal silicide contact region of a field effect transistor away from the first or other anisotropically etched spacer(s). For example, if defects might be formed in the silicide, such would be spaced further away from the spacers, and thereby further from the channel region, in such a field effect transistor.

Figure 8:
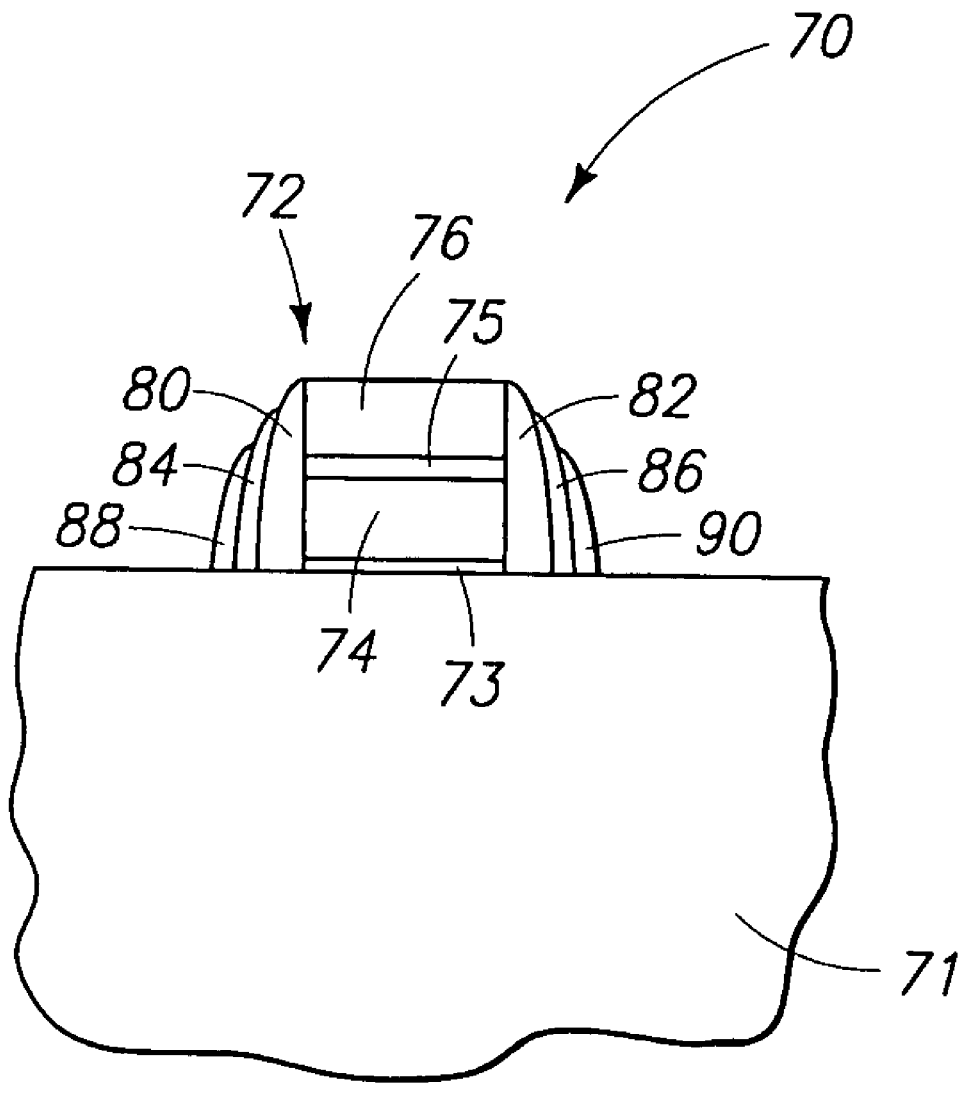
FIG. 8 is a diagrammatic sectional view taken through a semiconductor substrate in process in accordance with an aspect of the invention.

The invention also contemplates forming one or more intervening anisotropically etched sidewall spacers between the first and second anisotropically etched sidewall spacers. For example, FIG. 8 depicts an alternate embodiment substrate fragment 70 comprising a silicon-comprising substrate 71. An exemplary gate construction 72 is formed thereover, and comprises a gate oxide layer 73, a polysilicon region 74, a conductive silicide region 75, and an insulative cap 76. Gate construction 72 comprises first electrically insulative anisotropically etched sidewall spacers 80 and 82, intervening anisotropically etched sidewall spacers 84 and 86 formed thereover, and second anisotropically etched sidewall spacers 88 and 90 formed over intervening anisotropically etched sidewall spacers 84 and 86, respectively. Preferably, the material of intervening anisotropically etched spacers 84, 86 is different from that of spacers 80, 82 and 88, 90 (which of course could be the same or different material relative to one another, per the above). Metal layer deposition, annealing and silicide formation could otherwise occur, by way of example only, as referred to in the previous embodiments above. Further of course, any part or all of individual spacers 80-90 could be removed subsequently.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a field effect transistor, comprising:
    forming a gate electrode of a field effect transistor over a silicon-comprising substrate, the gate electrode comprising a sidewall;
    forming a first electrically insulative anisotropically etched sidewall spacer over the sidewall of the gate electrode;
    forming a second anisotropically etched sidewall spacer over and in direct physical contact with the first sidewall spacer, the second anisotropically etched sidewall spacer being distinct from the first sidewall spacer and the second anisotropically etched sidewall spacer comprising a combination of an electrically conductive material, an electrically insulative material, and a semiconductive material;
    depositing metal over the first and second sidewall spacers and over silicon of a source/drain region of the transistor proximate the second sidewall spacer; and
    annealing the substrate effective to react the metal with silicon of the substrate to form an electrically conductive metal silicide on the source/drain region which is spaced from the first sidewall spacer.

2. A method of forming a field effect transistor, comprising:
    forming a gate electrode of a field effect transistor over a silicon-comprising substrate, the gate electrode comprising a sidewall;
    forming a first electrically insulative anisotropically etched sidewall spacer over the sidewall of the gate electrode;
    forming a second anisotropically etched sidewall spacer over and in direct physical contact with the first sidewall spacer, the second anisotropically etched sidewall spacer being distinct from the first sidewall spacer and the second anisotropically etched sidewall spacer comprising a combination of an electrically conductive material, an electrically insulative material, and a semiconductive material;
    depositing metal over the first and second sidewall spacers and over silicon of a source/drain region of the transistor proximate the second sidewall spacer;
    annealing the substrate effective to react the metal with silicon of the substrate to form an electrically conductive metal silicide on the source/drain region which is spaced from the first sidewall spacer; and
    removing the second sidewall spacer from the substrate after the annealing.

3. A method of forming a field effect transistor, comprising:
    forming a gate electrode of a field effect transistor over a silicon-comprising substrate, the gate electrode comprising a first sidewall and a second sidewall on opposite sides of the gate electrode;
    forming a first electrically insulative anisotropically etched sidewall spacer over each of the first and second sidewalls of the gate electrode;
    depositing masking material over the gate electrode and over the first electrically insulative anisotropically etched sidewall spacer received over each of the first and second sidewalls of the gate electrode;
    etching the masking material to expose silicon on one of the opposite sides of the gate electrode and not on the other of the opposite sides of the gate electrode, the etching forming a second anisotropically etched sidewall spacer over and distinct from the first sidewall spacer on the one of the opposite sides and not on the other of the opposite sides;
    depositing metal over the first and second sidewall spacers and over silicon of a source/drain region of the transistor proximate the second sidewall spacer; and
    annealing the substrate effective to react the metal with silicon of the substrate to form an electrically conductive metal silicide on the source/drain region which is spaced from the first sidewall spacer.

4. The method of claim 3 wherein the masking material is electrically insulative.

5. The method of claim 3 wherein the masking material comprises amorphous carbon.

6. The method of claim 3 wherein the masking material comprises transparent carbon.

7. The method of claim 3 wherein the masking material is electrically conductive.

8. The method of claim 7 wherein the masking material comprises a metal nitride.

9. The method of claim 8 wherein the masking material comprises tungsten nitride.

10. The method of claim 8 wherein the masking material comprises titanium nitride.

11. The method of claim 3 wherein the masking material is semiconductive.

12. The method of claim 3 wherein the depositing of the masking material through said etching of the masking material to expose silicon occurs without any photolithographic patterning anywhere on the substrate.

13. The method of claim 3 wherein the etching of the masking material is selective relative to the first and second sidewall spacers.

* * * * *